(12) United States Patent
Hornbrook

(10) Patent No.: US 7,202,426 B2
(45) Date of Patent: Apr. 10, 2007

(54) MASTER CYLINDER POSITION SWITCH

(75) Inventor: Michael J. Hornbrook, Butler, IN (US)

(73) Assignee: Eaton Corporation, Cleveland, OH (US)

( * ) Notice: Subject to any disclaimer, the term of this patent is extended or adjusted under 35 U.S.C. 154(b) by 37 days.

(21) Appl. No.: 11/119,548

(22) Filed: May 2, 2005

(65) Prior Publication Data

US 2006/0243572 A1    Nov. 2, 2006

(51) Int. Cl.
*H01H 35/38* (2006.01)
(52) U.S. Cl. .................. 200/82; 200/61.45 R
(58) Field of Classification Search ........... 200/61.45 R–61.45 M, 86.5, 82 D; 307/119, 112–124; 335/205–207; 433/101; 600/573
See application file for complete search history.

(56) References Cited

U.S. PATENT DOCUMENTS

| | | | |
|---|---|---|---|
| 4,617,855 A * | 10/1986 | Wrobleski et al. ............. 92/5 R |
| 4,621,565 A * | 11/1986 | Leigh-Monstevens ........ 92/5 R |
| 4,756,159 A * | 7/1988 | Compton et al. ............. 60/584 |
| 5,002,166 A * | 3/1991 | Leigh-Monstevens et al. ............ 477/83 |
| 5,320,203 A * | 6/1994 | Wilber et al. ............ 192/109 F |
| 6,345,566 B1 * | 2/2002 | Stevens ....................... 92/5 R |
| 6,405,846 B1 * | 6/2002 | Reik et al. ............... 192/70.25 |
| 6,546,727 B2 * | 4/2003 | Bockling et al. ............. 60/591 |
| 6,703,830 B2 | 3/2004 | Kaste |
| 6,742,643 B2 * | 6/2004 | Nix et al. ................. 192/109 F |
| 6,769,254 B2 * | 8/2004 | Heller et al. .................. 60/589 |
| 6,951,104 B2 * | 10/2005 | Stobrawe et al. ............. 60/534 |
| 7,059,128 B2 * | 6/2006 | Rammhofer ................. 60/588 |
| 7,063,200 B2 * | 6/2006 | Takahashi ............... 192/109 F |

OTHER PUBLICATIONS

Tyco Electronics brochure "Non-contact Position Sensors".
Phoenix America Inc. Homepage www.phoenixamerica.com/products.

* cited by examiner

*Primary Examiner*—Michael Friedhofer
*Assistant Examiner*—Lisa Klaus
(74) *Attorney, Agent, or Firm*—Brooks Kushman P.C.

(57) ABSTRACT

A clutch assembly having a master cylinder that includes non-contacting position switches is disclosed. The master cylinder controls a slave cylinder that shifts the release bearing of the clutch system. A cruise control interrupt switch and an ignition system interlock switch are disclosed. The switches may be Hall effect or other non-contacting switches.

8 Claims, 2 Drawing Sheets

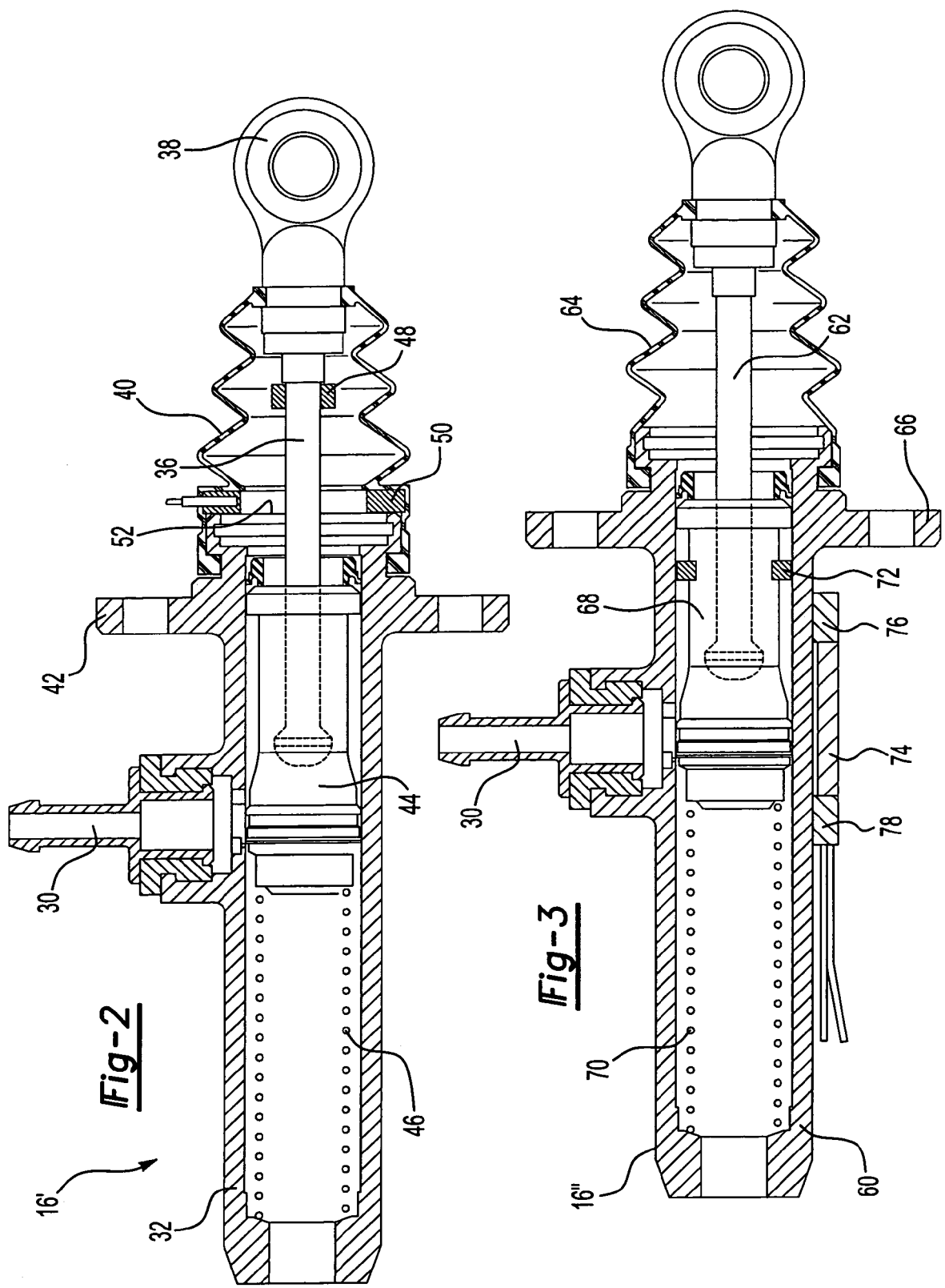

MASTER CYLINDER POSITION SWITCH

BACKGROUND OF THE INVENTION

1. Field of the Invention

The present invention relates to a master cylinder of a heavy duty truck clutch that has one or more switches for indicating the position of a clutch pedal.

2. Background Art

Heavy duty trucks are frequently manufactured with manual transmissions. Manual transmissions typically require depressing a clutch pedal to disengage the transmission and permit the transmission to be shifted between different gear sets. Other heavy duty truck systems may be integrated with a clutch pedal operation. For example, cruise control operation and engine ignition procedures generally require verification that the clutch pedal is in a particular position.

A cruise control interrupt switch may be provided as a normally closed switch that is opened immediately upon beginning depression of the clutch pedal. If a cruise control system remains operative while the clutch is disengaged, it may result in the engine racing while the truck decelerates as a result of disengaging the clutch. For this reason, a cruise control interrupt switch is frequently provided in association with a clutch pedal.

An engine ignition switch may be provided as a normally open switch that is closed when the clutch pedal is substantially fully depressed. It is desirable to preclude engine starting by the ignition system when the clutch is engaged to prevent the vehicle from lurching forward when the engine starts. An engine start switch is generally provided on a clutch pedal assembly at the maximum travel position of the clutch pedal to prevent engine ignition unless the clutch pedal is fully depressed.

In most instances two switches are provided on a clutch pedal box or as an elongated extension to the master cylinder. In the prior art, both switches in either the clutch pedal box or master cylinder embodiments use mechanical contact switches that are actuated by movement of the clutch pedal or master cylinder connecting rod. Mechanical switches are supported by the clutch pedal box and are contacted by the clutch pedal as it is moved during normal operation. Mechanical switches are subject to wear over time or may be damaged in use.

Some clutch systems may have a hydraulic power assist in which a master cylinder is shifted to cause a hydraulic circuit to shift a slave cylinder. The slave cylinder positions the clutch release bearing with a yoke mechanism. The use of a cylindrical or tubular mechanical switch section as an extension to a master cylinder has been proposed. An extended link piston rod must be used with the mechanical switch extension. The extended piston rod is provided with mechanical switch contacts that are open and closed as the piston rod moves relative to the cylinder. The mechanical switch extension is designed to be interposed between a protective rod boot and the master cylinder body. One problem associated with this approach is that the entire master cylinder assembly including the extended piston rod may be as much as two inches longer than a master cylinder that is not provided with the mechanical switch contacts. An increased length master cylinder is more difficult to locate on a truck and requires more space for installation and operation. The mechanical switch elements are subject to wear and may become contaminated with dirt and debris over time.

Applicant's invention is directed to solving the above problems and others as summarized below.

SUMMARY OF THE INVENTION

According to one aspect of the present invention a clutch system is provided that includes a clutch pedal that is moved between a normal position and a depressed position. A master cylinder is operatively connected to the clutch pedal. The master cylinder has a cylindrical tubular body portion and reciprocating rod portion. The body portion contains a fluid that flows into the body portion when the rod portion is extended from the body portion. The fluid flows out of the cylinder when the rod portion is retracted into the body portion. A switch having a first portion attached to the body portion and a second portion attached to the rod portion is operative to open or close an electrical circuit when the first and second portions are moved relative to each other. The first and second portions of the switch are retained in a non-contacting relationship. A slave cylinder is connected to the master cylinder by fluid conduit so that forces applied to the master cylinder are transferred to the slave cylinder by a fluid contained in the fluid conduit. The clutch system has a release bearing that is moved by the slave cylinder to release and engage a clutch pack.

According to other aspects of the present invention as it relates to a clutch system, the switch may be a Hall effect sensor, a magneto-resistive sensor, a reed switch, or a variable reluctance sensor wherein the first portion of the switch is a magnetic/ferrous ring and the second portion of the switch is a magnetic proximity sensor. The first portion of the switch comprising the magnetic/ferrous ring may be attached to the rod while the second portion of the switch comprising the magnetic proximity sensor is attached to the body portion. Alternatively, the switch may be a switch that detects changes in magnetic flux. The first portion of the switch may be a metallic ring and the second portion of the switch may be a sensor that detects changes in magnetic flux as the magnetic ring is moved by the second portion of the switch. The first portion of the switch may be a metallic ring attached to the rod while the second portion of the switch comprising the sensor for detecting changes in magnetic flux may be attached to the body portion of the master cylinder.

According to another embodiment of the invention, a master cylinder for a clutch actuation system is provided. The master cylinder includes a cylindrical tubular body portion in which a reciprocating rod portion is partially received. The body portion contains a fluid that flows into the cylinder when the rod portion is extended from the body portion. The fluid contained in the body portion flows out of the cylinder when the rod portion is retracted into the body portion. A retracted position switch having a first switch element attached to the body portion and a second switch element attached to the rod portion is also provided. The first and second switch elements of the retracted position switch are operative to actuate an electrical contact when the rod portion is initially moved toward the extended position. First and second switch elements of the retracted switch are maintained in a non-contacting relationship.

According to other aspects of the invention, the retracted position switch may be a Hall effect switch wherein the first switch element is a magnetic/ferrous ring and the second switch element is a magnetic proximity sensor. The second switch element may be an annular sensor that is secured to the end of the body portion without substantially increasing the length of the master cylinder. Alternatively, the retracted position switch may be a switch that detects changes in magnetic flux wherein the first switch element is a metallic ring and the second switch element of the retracted position switch is a sensor that detects changes in magnetic flux as the metallic ring is moved relative to the sensor. The metallic ring may be attached to the plunger. The plunger may be a molded plastic member that does not in and of itself cause changes in the magnetic flux sensed by the sensor.

The switch that detects changed in magnetic flux may be attached to the outer surface of the body portion to detect a movement of the metallic ring within the body portion. The body portion may be made of aluminum to reduce magnetic interference.

Another aspect of the present invention relates to providing a master cylinder for a clutch actuation system. The master cylinder includes a cylindrical tubular body portion and a reciprocal rod portion that is at least partially received in the body portion. The body portion contains a fluid that flows into the cylinder when the rod portion is extended from the body portion. The fluid contained in the body portion flows out of the cylinder when the rod portion is retracted into the body portion. An extended position switch is provided that has a first switch element that is attached to the body portion and the second switch element that is attached to the rod portion. The first and second elements of the extended position switch are operative to open a normally closed cruise control electrical contact when the rod portion is initially moved toward the retracted position. The first and second switch elements of the extended position switch are maintained in a non-contacting relationship. A retracted position switch is also provided that has a third switch element attached to the body portion that interacts with the second switch element attached to the rod portion. The third switch element of the retracted position switch is operative to close a normally open ignition system electrical contract when the rod portion is substantially fully retracted. The second and third switch elements of the retracted position switch are maintained in a non-contacting relationship.

According to other aspects of the invention, the extended position switch and retracted position switch may each be a Hall effect switch wherein a magnetic/ferrous ring is moved relative to a magnetic proximity sensor. Alternatively, the extended position switch and retracted position switch may be switches that detect changes in magnetic flux. Each switch may include a metallic ring and a sensor that detects changes in magnetic flux caused by movement of the magnetic ring relative to the sensor.

These and other aspects of Applicant's invention will be better understood in view of the attached drawings and detailed description of the illustrated embodiments of the invention.

BRIEF DESCRIPTION OF THE DRAWINGS

FIG. 2 is a cross-sectional view of a master cylinder having a Hall effect sensor for detecting the position of the rod portion relative to the cylindrical body portion of a hydraulic master cylinder; and FIG. 3 is cross-sectional view of a master cylinder having magneto-resistive switches for detecting two positions of the rod portion relative to a cylindrical body portion of a hydraulic master cylinder.

DETAILED DESCRIPTION OF THE PREFERRED EMBODIMENT(S)

Figure 1:
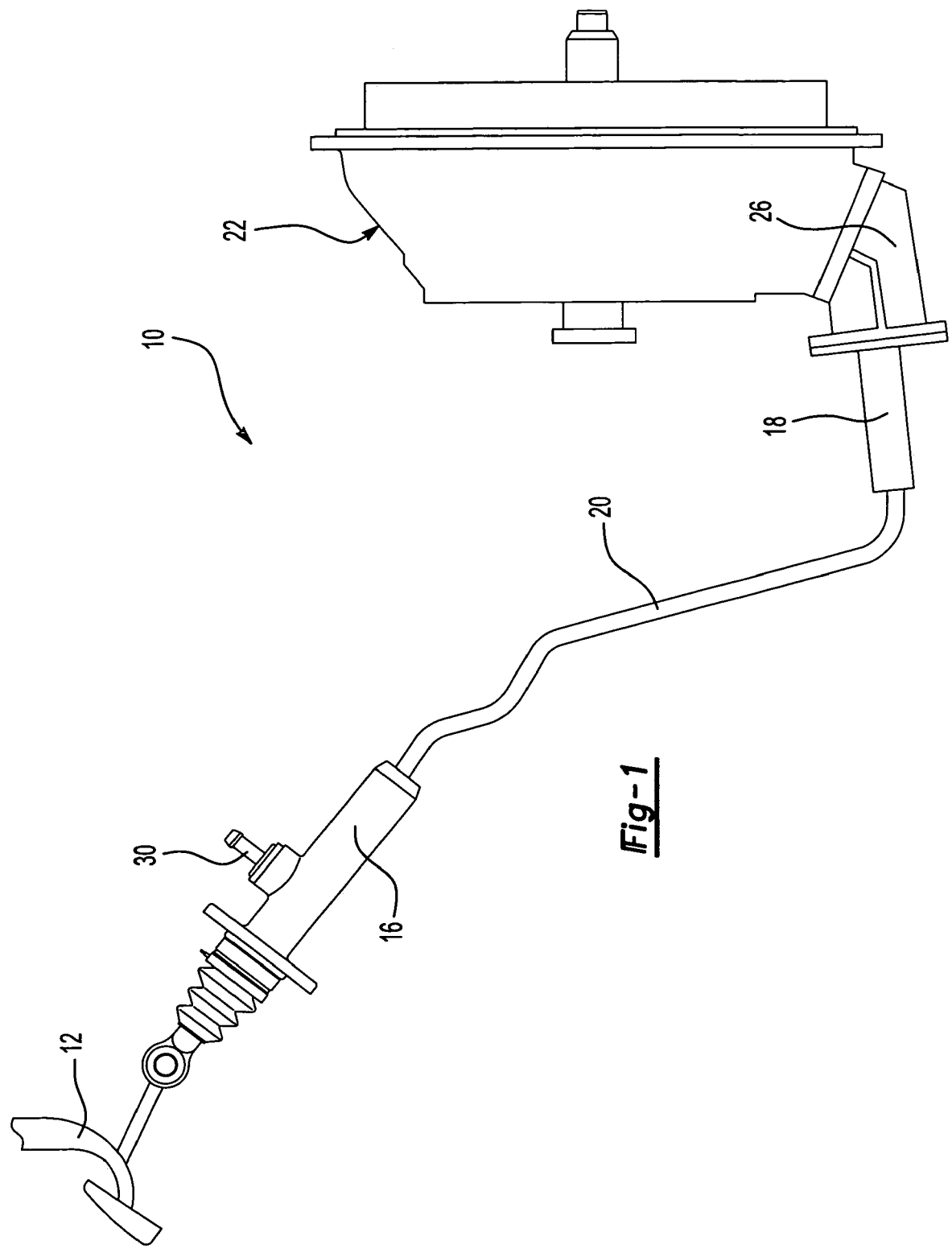
FIG. 1 is a schematic plan view of a hydraulically assisted clutch system.

Referring to FIG. 1, a clutch system 10 is diagrammatically illustrated for purposes of showing the environment of the present invention. The clutch system 10 includes a clutch pedal 12 that is connected to a master cylinder 16. The master cylinder 16 is part of a hydraulic clutch assist system in which the master cylinder 16 controls the operation of a slave cylinder 18. The master cylinder 16 is provided to the slave cylinder 18 through a fluid conduit 20, or tube. A clutch assembly 22 is released when the slave cylinder 18 is actuated. The slave cylinder 18 moves a shift fork actuator 26 to engage and disengage the clutch contained within the clutch assembly 22. Fluid is provided to the master cylinder 16 from a reservoir (not shown) through fluid supply connector 30.

Referring to FIG. 2, one embodiment of a master cylinder 16' is illustrated. The master cylinder 16' has a cylindrical body portion 32 and a rod 36, or connecting rod, that is partially disposed within the body portion 32. A rod connector 38 is provided at the distal end of the rod 36 and is adapted to be connected to a rod or other link to a pedal or pedal box. A boot 40 may be provided between the body portion 32 and the rod connector 38 to seal and protect the cylinder 16'. A mounting flange 42 is provided as part of the body portion 32 that is used to secure the master cylinder 16' to a bracket or other supporting structure of the vehicle. A plunger 44 is secured to the opposite end of the rod 36 from the rod connector 38 and is disposed within the body portion 32. A return spring 46 exerts a biasing force on the plunger 44 to bias the rod 36 toward its extended position. A magnetic/ferrous ring 48 is secured to the rod 36. A proximity sensor 50 is mounted immediately adjacent the open annular end 52 of the body portion 32. The proximity sensor 50 is preferably a relatively thin annular member to minimize the space required to house the master cylinder 16'.

The embodiment illustrated as master cylinder 16' would be best suited for a single switch contact. A single switch contact could be used with a truck that does not have cruise control, but requires an ignition switch to indicate when the master cylinder 16' is fully retracted as may happen when the clutch pedal is fully depressed. As shown in FIG. 2, when the rod 36 is shifted to the left to the maximum extent, the ring 48 passes by the proximity sensor 50 actuating the switch contact. While a single contact is shown for the master cylinder 16', additional contact points could be provided by providing additional magnetic/ferrous rings 48 along the length of rod 36.

Referring to FIG. 3, another alternative embodiment of a master cylinder 16" is illustrated. Master cylinder 16" has a body portion 60 within which a rod 62 is partially received for reciprocal movement. A boot 64 may be provided between rod 62, or rod connector, and the body portion 60 of the master cylinder 16". A mounting flange 66 is formed on the body portion 60 and is used to mount the master cylinder 16" to a bracket or other supporting surface on a vehicle. A plunger 68 is disposed within the body portion 60 and is secured to rod 62. The plunger 68 may be formed from a non-metallic material, for example, a rigid polymer. A return spring 70 is provided within the body portion 60 to bias the plunger 68 and rod 62 toward the extended position. A metallic ring 72, or second switch element, is secured to the plunger 68 and indirectly to the rod 62. A dual sensor 74 that detects changes in magnetic flux is mounted to the exterior surface of the body portion 60 and includes a beginning of travel sensor 76, or first switch element, and an end of travel sensor 78, or third switch element, at opposite ends of the sensor 74. When the metallic ring 72 passes by the beginning of travel sensor 76, a beginning of travel switch may be actuated to, for example, disable a cruise control system. As the rod 62 and plunger 68 continue retracting into the body portion 60, the metallic ring 72 may be moved into alignment with the end of travel sensor 78. When the ring 72 passes the end of travel sensor 78, a switch may be actuated to enable the ignition system of a vehicle to operate.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A clutch system comprising:
   a clutch pedal that is moved between a normal position and a depressed position;
   a master cylinder that is operatively connected to the clutch pedal, the master cylinder having a cylindrical tubular body portion and a reciprocal rod portion, wherein the body portion contains a fluid that flows into the cylinder when the rod portion is extended from the body portion and that flows out of the cylinder when the rod portion is retracted into the body portion;
   a switch having a sensor attached to the body portion and a metallic ring attached to the rod portion, the sensor and ring of the switch being operative to open and close an electrical circuit when they are moved relative to each other, the sensor and ring of the switch being retained in a non-contacting relationship, wherein the sensor detects changes in magnetic flux as the metallic ring is moved relative to the sensor;
   a slave cylinder that is connected to the master cylinder by a fluid conduit so that forces applied to the master cylinder are transferred to the slave cylinder by a fluid contained in the fluid conduit; and
   a clutch that is released and engaged by the slave cylinder.

2. A master cylinder for a clutch actuation system, comprising:
   a cylindrical tubular body portion;
   a reciprocal rod portion that is at least partially received in the body portion, wherein the body portion contains a fluid that flows into the cylinder when the rod portion is extended from the body portion, the fluid contained in the body portion flows out of the cylinder when the rod portion is retracted into the body portion;
   a retracted position switch having a sensor attached to the body portion and a metallic member attached to the rod portion, the sensor and metallic member of the retracted position switch being operative to actuate an electrical contact when the rod portion is initially moved toward the extended position, the sensor and metallic member of the retracted position switch being maintained in a non-contacting relationship, and wherein the sensor detects changes in magnetic flux as the metallic member is moved relative to the sensor.

3. The master cylinder of claim 2 wherein the metallic ring is attached to a plunger that is in turn secured to an end of the rod portion that is retained in the body portion.

4. The master cylinder of claim 3 wherein the plunger is a molded plastic member.

5. The master cylinder of claim 2 wherein the sensor is attached to the outer surface of the body portion that detects the movement of the metallic ring through the body portion.

6. The master cylinder of claim 5 wherein the body portion is an aluminum member.

7. A master cylinder for a clutch actuation system, comprising:
   a cylindrical tubular body portion;
   a reciprocal rod portion that is at least partially received in the body portion, wherein the body portion contains a fluid that flows into the cylinder when the rod portion is extended from the body portion, the fluid contained in the body portion flows out of the cylinder when the rod portion is retracted into the body portion;
   an extended position switch having a first switch element attached to the body portion and a second switch element attached to the rod portion, the first and second switch elements of the extended position switch being operative to open a normally closed electrical contact when the rod portion is initially moved toward the retracted position, the first and second switch elements of the extended position switch being maintained in a non-contacting relationship; and
   a retracted position switch having a third switch element attached to the body portion detects movement of the second switch element that is attached to the rod portion, the third switch element of the retracted position switch being operative to close a normally open electrical contact when the second switch element that is disposed on the rod portion is substantially fully retracted, the second and third switch elements being maintained in a non-contacting relationship.

8. The master cylinder of claim 7 wherein the first switch element and the third switch element detect changes in magnetic flux, the first switch element is a first sensor that detects changes in magnetic flux and the second switch element is a metallic ring that is moved relative to the first sensor, the third switch element detects changes in magnetic flux as the second switch element is moved relative to the third switch element.

* * * * *